United States Patent [19]
Rostoker

[11] Patent Number: 5,767,580
[45] Date of Patent: Jun. 16, 1998

[54] SYSTEMS HAVING SHAPED, SELF-ALIGNING MICRO-BUMP STRUCTURES

[75] Inventor: Michael D. Rostoker, Boulder Creek, Calif.

[73] Assignee: LSI Logic Corporation, Milpitas, Calif.

[21] Appl. No.: 573,892

[22] Filed: Dec. 18, 1995

Related U.S. Application Data

[63] Continuation-in-part of Ser. No. 55,429, Apr. 30, 1993, Pat. No. 5,477,086.
[51] Int. Cl.⁶ .................... H01L 23/48; H01L 23/52; H01L 29/40
[52] U.S. Cl. .................... 257/737; 257/738; 257/786; 257/780
[58] Field of Search .................... 257/673, 692, 257/697, 700, 773, 774, 778, 780, 786, 779, 737, 738

[56] References Cited

U.S. PATENT DOCUMENTS

| | | | |
|---|---|---|---|
| 3,339,274 | 9/1967 | Saia et al. | |
| 3,461,357 | 8/1969 | Mutter et al. | 317/234 |
| 3,811,186 | 5/1974 | Lamerd et al. | 29/626 |
| 4,151,543 | 4/1979 | Hayakawa et al. | 357/68 |
| 4,545,610 | 10/1985 | Lakritz et al. | 29/589 |
| 4,664,309 | 5/1987 | Allen et al. | 257/774 |
| 4,700,276 | 10/1987 | Freyman et al. | 361/414 |
| 4,717,066 | 1/1988 | Goldenberg et al. | 228/179 |

(List continued on next page.)

FOREIGN PATENT DOCUMENTS

| | | |
|---|---|---|
| 57-106056 | 7/1982 | Japan . |
| 58-225652 | 12/1983 | Japan . |
| 60-233833 | 5/1984 | Japan . |
| 59-182548 | 10/1984 | Japan . |
| 60-49638 | 3/1985 | Japan . |

(List continued on next page.)

OTHER PUBLICATIONS

Honda, Susumu—Mounting Technology for MCM and Bare Chips—New Technology Development Makes Bare Chip Mounting Easy—May 1994, pp. 37–42.

Packaging Ideas by Howard Markstein Electronic Packaging & Production, May 1992, pp. 25–26.

LED Array Modules by New Technology Microbump Bonding Method by Kenzo Hatada, et al. IEEE Transactions on Components, Hybrids, and Manufacturing Technology, vol. 13, No. 3, Sep. 1990.

Overmolded Plastic Pad Array Carriers by Bruce Freyman, et al. 0569–5503/91/0000–0176, 1991 IEEE.

Lead–Indium for Joining a Semiconductor Chip to a Substrate L.S. Goldmann, et al. IBM Technical Disclosure Bulletin, vol. 16, No. 11, Apr. 1974.

*Primary Examiner*—Sara W. Crane
*Assistant Examiner*—Phat X. Cao
*Attorney, Agent, or Firm*—Katz & Cotton, LLP

[57] ABSTRACT

A digital system utilizing at least one semiconductor integrated circuit die having positive mechanical alignment is provided between substrates using micro-bump contacts by forming "detented" conductive bump contacts on one substrate having a concave end which receive and align the generally convex contour of bump contacts on the other substrate. Various configurations of concavities and convexities are described. Flux may be disposed in the concave end of the detented bump contact to promote formation of joints between the concave and convex bump contacts. Both bump contacts may be formed of reflowable material, such as solder, or one or the other of the contacts may be formed of a non-reflowable material which may also function as a standoff between the two substrates. Each substrate is provided with a plurality of bump contacts, and one substrate may be provided with a combination of convex and concave bump contacts corresponding to concave and convex bump contacts on the other substrate. The inventive technique is useful for joining die-to-die, die-to-substrate, or package-to-substrate in a digital system.

40 Claims, 8 Drawing Sheets

U.S. PATENT DOCUMENTS

| | | | |
|---|---|---|---|
| 4,801,992 | 1/1989 | Golubic | 257/737 |
| 4,825,284 | 4/1989 | Soga et al. | 357/80 |
| 4,857,482 | 8/1989 | Saito | 437/209 |
| 4,912,545 | 3/1990 | Go | 257/737 |
| 4,926,241 | 5/1990 | Carey | 357/75 |
| 5,006,673 | 4/1991 | Freyman et al. | 174/255 |
| 5,014,111 | 5/1991 | Tsuda et al. | 357/68 |
| 5,077,633 | 12/1991 | Freyman et al. | 361/403 |
| 5,108,950 | 4/1992 | Wakabayashi et al. | 257/737 |
| 5,111,279 | 5/1992 | Pasch et al. | 357/81 |
| 5,196,726 | 3/1993 | Nishiguchi et al. | 257/737 |
| 5,311,402 | 5/1994 | Kobayashi et al. | 361/760 |
| 5,404,047 | 4/1995 | Rostoker et al. | 257/786 |
| 5,468,999 | 11/1995 | Lin et al. | 257/700 |
| 5,477,086 | 12/1995 | Rostoker et al. | 257/692 |
| 5,525,838 | 6/1996 | Kaneko | 257/786 |

FOREIGN PATENT DOCUMENTS

| | | |
|---|---|---|
| 62-95838 | 5/1987 | Japan . |
| 63-161633 | 7/1988 | Japan . |
| 2-235350 | 3/1989 | Japan . |
| 1-122582 | 5/1989 | Japan . |
| 4-225542 | 8/1992 | Japan . |
| 4-266037 | 9/1992 | Japan . |
| 5-144815 | 6/1993 | Japan . |
| 6-104261 | 4/1994 | Japan . |
| WO 89/02653 | 3/1989 | WIPO . |

SECTION A-A'

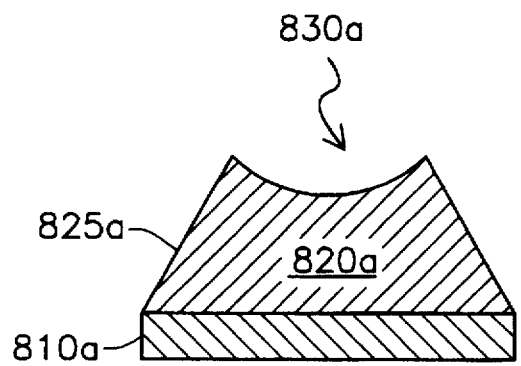
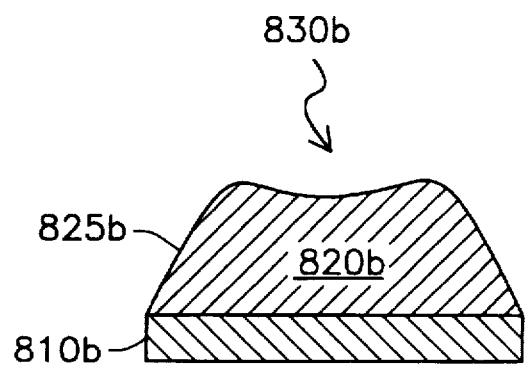
FIG. 8a   FIG. 8b
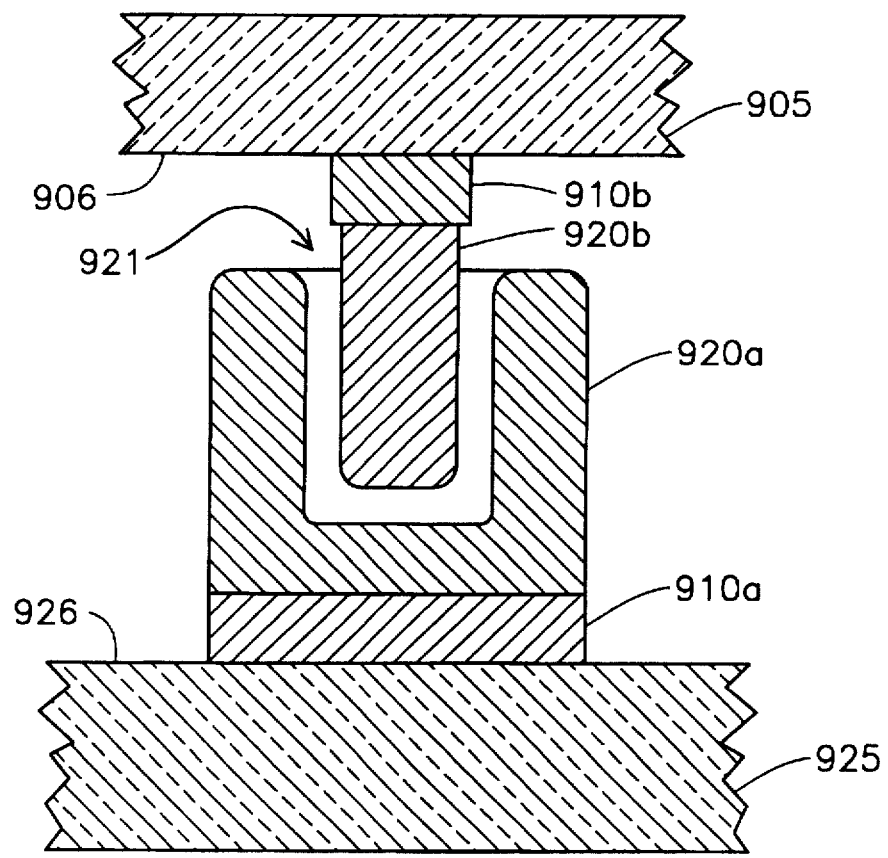
FIG. 9

SYSTEMS HAVING SHAPED, SELF-ALIGNING MICRO-BUMP STRUCTURES

CROSS REFERENCE TO RELATED PATENT APPLICATION

This patent application is a CIP of U.S. patent application Ser. No. 08/055,429, filed Apr. 30, 1993, now U.S. Pat. No. 5,477,086 issued Dec. 19, 1995, entitled "SHAPED, SELF-ALIGNING MICRO-BUMP STRUCTURES," by Michael D. Rostoker and Nicholas F. Pasch.

BACKGROUND OF THE INVENTION

1. Technical Field of the Invention

The present invention relates generally to digital electronic systems utilizing semiconductor "flip-chip" and pad array manufacturing and assembly techniques and, more particularly, to digital electronic systems utilizing semiconductor devices having the configuration and shape of conductive micro-bumps on the surface of a chip, semiconductor device package, and/or a substrate.

2. Background of the Invention

A number of patents show that a semiconductor die (or "chip") can be "flip-chip" mounted and connected to another die (or "substrate") via a pattern or array of conductive bumps disposed one a surface of a semiconductor die. For example U.S. Pat. Nos. 4,825,284 and 4,926,241, incorporated herein by reference, describe method for "flip-chip" mounting of a semiconductor to a substrate by means of conductive (solder) bumps. Typically, the conductive bumps are ball-like structures formed of solder and disposed in a pattern on a surface of a die. A mating pattern of bond pads and/or similar conductive bumps is disposed of a surface of the substrate. The die is positioned over the substrate so that the die bumps are aligned with the substrate bumps, and the conductive bumps on the die are "re-flowed" or otherwise fused to their counterparts on the surface of the substrate to form electrical and mechanical connections between the die and the substrate.

Similar techniques are known in the art for mounting a packaged semiconductor device to a printed circuit board or other substrate. U.S. Pat. Nos. 4,700,276, 5,006,673, and 5,077,633, incorporated herein by reference, are generally directed to such techniques. Packaged semiconductor devices employing conductive bumps are commonly referred to as "pad array chip carriers". Other references to pad array chip carriers and similar mounting techniques are found in "Pad Array Improves Density" (Electronic Packaging and Production, May 1992, p. 25.), "Overmolded Plastic Pad Array Carriers (OMPAC): A Low-Cost, High Interconnect Density IC Packaging Solution for Consumer and Industrial Electronics", (Freyman and Pennisi, IEEE Publication No. 0569-5503/91/0000-176, 1991), and "LED Array Modules by New Technology Microbump Bonding Method" (Hatada, Fujimoto, Ochi, Ishida, IEEE Transactions on Components, Hybrids and Manufacturing Technology, Vol. 13, No. 3, September 1990, pp. 521–527).

A related mounting technique is disclosed in U.S. Pat. No. 4,717,066, incorporated herein by reference, wherein a gold alloy is used for the conductive bumps (balls) rather than solder.

Hereinafter, all conductive bump connection techniques, both for chips (semiconductor dies, e.g., "flip-chip" mounting) and for packaged semiconductor devices (e.g., pad array chip carriers) will be referred to collectively as "micro-bump bonding".

Generally, as used herein, a micro-bump bonded assembly includes one or more relatively small silicon chips (or packages) mounted in face-to-face relationship to a larger silicon chip, package, or substrate. Solder balls (micro-bumps) are formed on the opposing (facing) faces of the chips (or packages) and the substrate, at a number of positions corresponding to one another. In other words, the pattern and spacing of the solder balls on the chip (or package) match the pattern and spacing of solder balls on the substrate. The chip (or package) is brought into face-to-face relationship with the substrate, and with the solder balls of the chip (or package) are aligned with the solder balls of the substrate, the chip (package) and substrate are subjected to heat, which (ideally) causes the solder balls of the chip (package) to fuse with the corresponding solder balls of the substrate.

Generally, conductive bumps such as solder balls are formed on conductive pads (bond pads) disposed on a surface of a die or substrate. These bond pads are generally either rectangular or circular.

FIG. 1a shows a typical rectangular bond pad 110a. The corners of such rectangular bond pads are often rounded, as shown in the figure. Sometimes such rectangular bond pads are somewhat elongated, rather than substantially square, as shown.

FIG. 1b shows a typical "round" bond pad 110b. As shown in the figure, the bond pad 110b is substantially circular. Sometimes, "round" bond pads may be somewhat elliptical in shape, rather than substantially circular, as shown.

FIG. 1c shows a typical conductive bump contact 120 (e.g., solder bump) disposed on a bond pad 110c. (The bond pad 110c is e.g., formed in a manner similar to the bond pad 110b of FIG. 1b.) As shown the conductive bump contact 120 has a convex-shaped surface. Often such conductive bumps 120 are formed by re-flowing a solder paste deposited on the bond pad 110c. Depending upon the amount of solder (paste) used, the shape of the conductive bump 120 after re-flowing may vary. Surface tension of the solder in the molten state dictates a convex shape. A relatively small amount of solder will form a conductive bump shaped similar to the conductive bump 120 in FIG. 1c. on a rectangular bond pad (e.g., 110a FIG. 1a) such a conductive bump would have a "pillow" shape, while on a round bond pad, it would have a more hemi-spherical (spherical sectional) shape. However, a relatively large amount (glob) of solder paste will, when re-flowed, form a large ball like (more completely spherical) structure (not shown) atop the bond pad 110c.

Various problems may attend such micro-bump formation and bonding techniques, particularly regarding the formation of reliable solder joints between the solder balls of the chip and the solder balls of the substrate. For example, as disclosed in commonly-owned U.S. Pat. No. 5,111,279, incorporated by reference herein, applying liquid flux to the entire surface of the substrate, prior to placing a chip on a substrate, can cause the chip to be drawn (migrate) to the center of the substrate due to capillary action and/or surface tension. As further disclosed in the patent, it is sometimes difficult to ensure that the solder balls of the chip will successfully fuse to the solder balls of the substrate. Further, as disclosed in the patent, the mechanical structure resulting from the solder balls fusing together may be somewhat indeterminate. The patent discloses a preformed planar structure inserted between the chip and the substrate to help overcome these problems.

U.S. Pat. No. 4,545,610, incorporated by reference herein, discloses a technique for forming "elongated" micro-bump solder connections between a package and a substrate, thereby controlling, to some degree, the shape of the solder connection and the spacing between the package and the substrate.

Another problem attendant micro-bump assembly of a chip to a substrate (both having solder bumps) is that in the process of placing a solder-bumped integrated circuit (chip) onto a substrate, it is common to have some problems placing the chip without the chip slipping out of alignment. If both sets of solder bumps have been reflowed, alignment of the chip involves "balancing" one solder bump ball on top of another solder bump ball. Evidently, a ball does not inherently want to rest upon another ball, this being an unstable configuration which is subject to misalignment of the chip with the substrate, such as in response to mechanical vibration and the like.

This "balancing act" problem is illustrated in FIG. 2. A semiconductor device 225 has a raised conductive bump contact 220b formed on a bond pad 210b on a surface of the semiconductor device 225. A substrate 205, to which the semiconductor device 225 is to be assembled to form a semiconductor device assembly 200, has a bond pad 210a with a similar, mating conductive bump 220a. The semiconductor device 225 is positioned over the substrate 205 such that the two conductive bump contacts 220a and 220b (typically formed of solder) come into contact with one another. In a subsequent step, the conductive bump contacts 220a and 220b will be fused (typically by heat-induced re-flow of the solder) to form a single electrical and mechanical connection between the semiconductor device 225 and the substrate 205. Evidently, the interface between the bump contacts 220a and 220b, as shown, is an unstable one if the semiconductor device 225 is not mechanically "registered" to the substrate 205. Without such mechanical registration, it is relatively easy for the conductive bump contact 220b on the semiconductor device 225 to slide off of the conductive bump contact 220a on the substrate 205.

It is known to provide for positive mechanical registration between a semiconductor device and a substrate by securely 'chucking' the semiconductor device (e.g., chip), i.e., holding it in precise mechanical alignment with the substrate during the assembly process (i.e., while the solder balls are being fused to one another), to avoid movement (misalignment) of the semiconductor device (chip) due to surface tension and/or capillary action (i.e., caused by liquid flux) and/or mechanical vibration during the flip-chip assembly process.

Several other techniques are known for improving alignment during micro-bump bonding. U.S. Pat. No. 3,811,186, incorporated by reference herein, describes a technique whereby a self-aligning spacer is disposed between the die or package and the substrate.

The spacer is sized to nearly exactly fit between the conductive bumps on the substrate (and between the conductive bumps on the package or die) thereby providing spacing and registration between the substrate and the die or package.

Another self-alignment technique for micro-bump bonding is describe in Japanese Patent No. 60-49638 (A), wherein conductive pads on a die-receiving substrate are "dented" in a pattern to match the conductive bumps on the die (i.e., holes are formed in substrate positioned to "capture" the bumps on the die). While this technique does improve alignment during assembly, it suffers from many of the other problems described hereinabove, e.g., uncertain contact shape and height of the ultimate solder joint, uncertain spacing between the die and the substrate, etc.

OBJECTS OF THE INVENTION

It is an object of the present invention to provide a system utilizing semiconductor assemblies, especially flip-chip assemblies.

It is a further object of the present invention to provide a system utilizing semiconductor assemblies having simplified face-to-face joining of a chip to a substrate.

It is a further object of the present invention to provide a system utilizing semiconductor assemblies having at least one chip (or package) having a controlled position of vis-a-vis a substrate, during flip-chip assembly, without requiring securely chucking the chip to maintain precise alignment of the chip to the substrate.

It is a further object of the present invention to provide a system utilizing semiconductor assemblies having a solder bump structure for flip-chip chips and/or substrates that tends to cause the chip (or substrate) to be both self-aligning and stable vis-a-vis the substrate (or vice-versa).

It is a further object of the present invention to provide a system utilizing semiconductor assemblies fabricated with an improved technique for formation of joints in using solder bumps.

SUMMARY OF THE INVENTION

The present invention provides for digital electronic systems utilizing a first substrate (chip, die, semiconductor package, circuit board, etc.) provided with a first set of solder bumps, which may be in the shape of normally preformed solder balls. A second substrate (chip, die, semiconductor package, circuit board, etc.) is provided with a second set of solder bumps. The second set of solder bumps are provided with a concave depression, or "detent", to receive a corresponding solder ball. The pattern and spacing (layout) of the solder balls on the first substrate match the pattern and spacing of solder bumps on the second substrate. The first substrate is brought into a face-to-face relationship with the second substrate, with the solder bumps of the first substrate aligned with the solder bumps of the second substrate, and the first and second substrates are subjected to heat, which causes the solder bumps of the first substrate to fuse with the corresponding solder bumps of the second substrate.

By providing detented conductive bumps on the second substrate, the conventional convex balls are caused to "nest" within the detent, providing positive mechanical alignment between the first substrate (e.g., die) and the second substrate (e.g., substrate). Either gravity or externally applied pressure may be used to maintain the alignment. Thus, two substrates with mating conductive ball/bump contacts are more easily and accurately held in place, since there is an inherent tendency for the contacts to "fall" into alignment and to maintain that alignment during assembly.

It is contemplated that the method and apparatus of the present invention may be utilized in system level products comprising single chip modules (SCM) often including other electrical components (such as capacitors, resistors, inductors, etc.); multi-chip modules (MCM) having at least two integrated circuit dice in the same or separate resin and/or substrate board packages, with or without other electrical components; board level products (BLP) such as those having multiple integrated circuits on printed wiring board(s) (PWB); and box level products (Boxes) which may include a combination of elements from the list of SCM, MCM, BLP and the like. One or more of such SCM, MCM, PWB or BLP's may act as, or be integrated into a functional system or subsystem. The system level products contemplated include digital (or other) data storage systems; security and surveillance systems, general purpose computers (such as personal computers, work stations, servers, mini computers, mainframe computers and super computers); digital audio and video compression and transmission systems; transportation vehicles (such as airplanes, trains, automobiles, helicopters, rockets, missiles, boats, submarines, and the like); subsystems utilized in such vehicles (such as navigational positioning, i.e., Global Positioning System (GPS), navigational displays and controllers, hazard avoidance such as radar and sonar, fly by wire control, and digital engine control and monitoring); entertainment systems (such as digital television and radio, digital cameras, audio and video recorders, compact disc players, digital tape, or the like); and communications systems (such as PBX, telephone switching, voice mail, auto attendant, network controllers, video teleconferencing, digital data transmission (such as token ring, ethernet, ATM, or the like), and including subsystems or subassemblies for inclusion or attachment to more complex system level products.

The present invention may be applied to miniboard type devices as more fully described in commonly owned U.S. patent application Ser. No. 08/135,777, entitled "METHOD FOR MOUNTING INTEGRATED CIRCUIT CHIPS ON A MINI-BOARD (as amended)," filed Oct. 12, 1993 by Rostoker et al.; and MCM flip chip type devices as more fully described in commonly owned U.S. patent application Ser. No. 07/975,185, entitled "MULTI-CHIP SEMICONDUCTOR ARRANGEMENTS USING FLIP CHIP DIES," filed Nov. 12, 1992 by Michael D. Rostoker, both applications incorporated by reference herein for all purposes. Additionally, such sub-assemblies or packages using such self-aligned micro-bump structures may be used in traditional circuit boards or sub-assemblies for a system level product as more fully described hereinafter.

According to the present invention, novel self-aligning "detented" conductive bump contacts comprise a raised structure of a conductive material extending from a surface of a substrate. One end of the conductive material is supported on the surface of the substrate. Another end of the conductive material is elevated above the surface of the substrate. A concave depression is formed in the elevated end of the conductive material and is sized and shaped to receive and to align a corresponding convex surface of a mating conductive ball contact.

According to an aspect of the invention, the detented conductive bump contacts may be formed of a heat re-flowable material, such as tin-lead solder, or of a non-flowable material, such as copper, a copper alloy, gold, a gold alloy, silver, or a silver alloy.

According to another aspect of the invention, the exterior walls (forming the exterior shape) of the detented bump contact may be vertically straight, tapered, or generally rounded in a convex shape outside of the area of the concave depression.

According to another aspect of the invention, the concave depression can extend either partially or completely through the conductive material of the bump contact.

According to another aspect of the invention, a vent opening can be provided through the exterior walls of the conductive material between the concave depression and the exterior of the conductive material, to permit the escape of expanding trapped gases or molten flux during assembly (i.e., during assembly of the first substrate to the second substrate).

According to another aspect of the invention, the conductive bump contact is formed atop a conductive bond pad. The conductive bond pad can have a solid shape, a ring shape, or a gapped ring shape, and can be generally round or rectangular. The gap in the gapped ring shape facilitates venting of expanding gases during assembly.

According to another aspect of the invention, flux can be disposed within the concave depression to facilitate "wetting" of the heat-flowable material (e.g., solder).

According to another aspect of the invention, the conductive ball (contact) on the first substrate has a convex "pin" shape, and the concave depression in the conductive bump of the second substrate can be sized and shape to form a matching "socket" to receive the pin-shaped contact. In this case, the first substrate is provided with a convex pin-like structure, rather than with a ball.

Other aspects and embodiments are directed to mating self-aligning contact pairs (balls/pins and bumps), and to methods of forming self-aligning conductive bump contacts and self-aligning micro-bump bonds.

Throughout the description, contacts on the first substrate are generally referred to as "balls", whether in the general shape of a sphere or in the shape of a pin, and contacts on the second substrate are referred to as "bumps". Generally, the contacts on the first substrate are generally convex, and the contacts on the second substrate are generally concave. In this manner, the balls align (nest) into the bumps. It is assumed throughout the description that the balls and bumps are formed on conductive bond pads disposed on surfaces of the respective first and second substrates.

Other objects, features and advantages of the invention will become apparent in light of the following description thereof.

BRIEF DESCRIPTION OF THE DRAWINGS

FIG. 8a is a cross-sectional view of a cone-shaped "formed" conductive bump contact, according to the present invention;

FIG. 8b is a cross-sectional view of a "dented sphere" conductive bump contact, according to the present invention;

FIG. 9 is a cross sectional view of a "plug (pin-like bump) and socket" conductive bump contact arrangement, according to the present invention;

DETAILED DESCRIPTION OF THE INVENTION

Figure 1A:
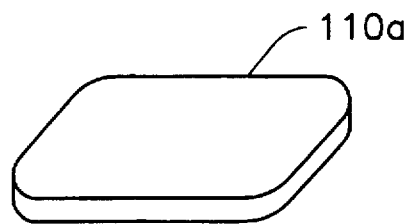
FIG. 1a is a perspective view of a prior art rectangular bond pad.
Figure 1C:
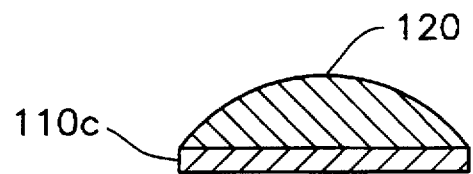
FIG. 1c is a cross-sectional view of a prior art conductive ball-shaped bump contact atop a bond pad on a surface of a substrate (not shown)
Figure 1B:
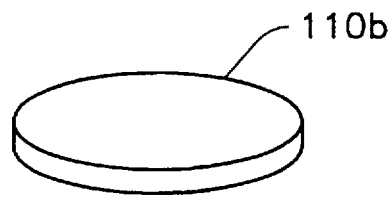
FIG. 1b is a perspective view of a prior art round bond pad.
Figure 2:
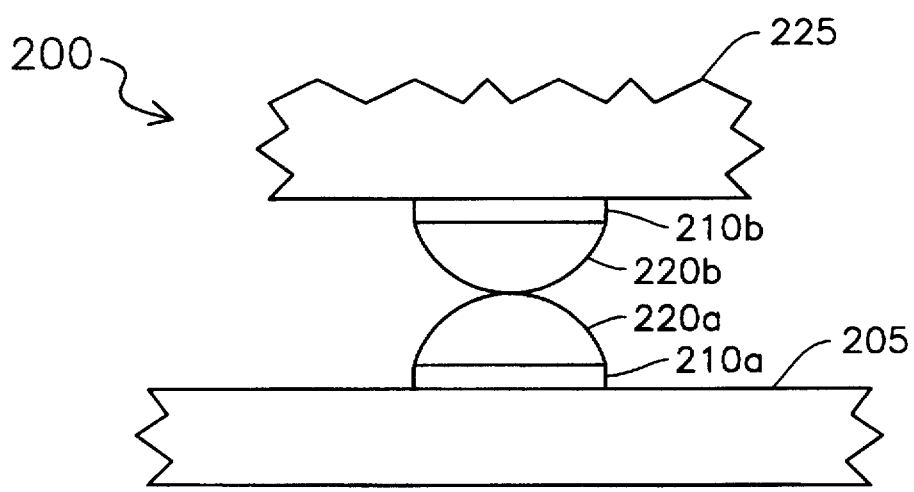
FIG. 2 is a side view of two prior art conductive ball-type bump contacts in contact with one another, one of the contacts on one substrate and the other of the contacts on another substrate.

Referring now to the drawings, the details of preferred embodiments are schematically illustrated. Like elements are numbered the same, and similar elements are represented by the same number and a different lower case letter suffix. According to the invention, significant improvement to mechanical formation and registration of connections formed by micro-bump bonding may be realized through the use of "formed" or "shaped" conductive bump contacts, especially when one of a pair of mating conductive bump contacts has a concave or "detented" surface contour to "capture" or "receive" a convex contour on the other of the pair.

According to the invention, different techniques may be employed for forming "detented" conductive bumps. In general, surface tension will cause a re-flowed solder bump to form into a generally convex shape. However, this convex shape forms, in part because of uniform adherence to a bond pad onto which the solder bump is formed. As will be discussed in greater detail hereinbelow, if a solder paste is disposed over the surface of a ring-shaped conductive bond pad, the bond pad having a central void (or opening), the resulting solder bump contact (formed by reflowing the solder paste with heat) will have either a detent or a void in the generally vicinity of the opening in the ring shape of the bond pad.

Figure 3A:
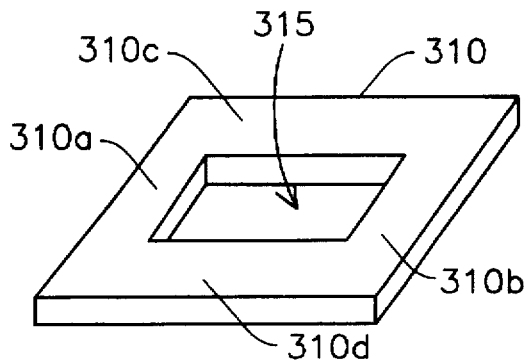
FIG. 3a is a perspective view of a rectangular ring-shaped bond pad, according to the present invention.

FIG. 3a is a perspective view of a rectangular ring-shaped bond pad 310, according to the present invention. The bond pad 310 is formed of a material which is readily wetted by solder (a material to which solder readily adheres in its molten state), such as copper or its alloys, gold or its alloys, silver or its alloys, or any of various plated combinations using these materials. The rectangular ring-shaped bond pad 310 is characterized by four joined linear segments 310a, 310b, 310c, and 310d, forming an opening 315 therebetween.

Figure 3B:
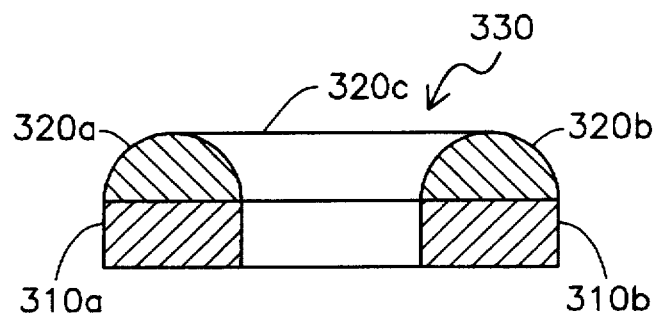
FIG. 3b is a cross-sectional view of a detented conductive bump contact, according to the present invention.

Solder paste is applied to the surface of the bond pad 310 and then is re-flowed by applying heat. The resulting structure is shown in FIG. 3b, wherein it can readily be seen that the resulting conductive bump formed atop the bond pad exhibits a central "void" in line with the opening 315 of the bond pad. In the cross-sectional view of FIG. 3b, a view is taken which slices through two of the linear segments 310a and 310b of the bond pad the bond pad 310 such that a third linear segment 310c appears in the background. The solder paste re-flows over the linear segments in a convex shape, as shown. A convex cross-sectional solder bump contact contour 320a is formed over and adheres to linear segment 310a. Another, similar convex solder bump contact contour 320b is formed over and adheres to linear segment 310b. A third portion 320c of the solder bump contact is shown in the background formed over and adhering to linear segment 310c. The resultant solder bump contact (310a, 310b, 310c, and a fourth segment not shown in the cross-sectional view of FIG. 3b) has a substantially rectangular, rounded ring shape with a centrally located void 330. This void 330 is useful for mechanically registering a mating conductive bump contact (ball), as is described in greater detail hereinbelow with respect to FIG. 6a.

Figure 4A:
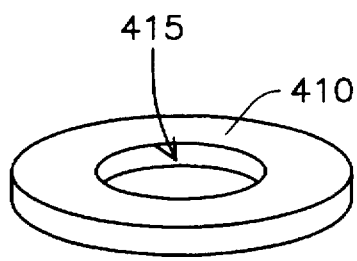
FIG. 4a is a view of a round ring-shaped bond pad, according to the present invention.

FIG. 4a is a perspective view of a round ring-shaped bond pad 410, according to the present invention. The bond pad 410 is similar to the bond pad 310 of FIG. 3a, except that it is round rather than rectangular. However, in a manner similar to the rectangular bond pad 310 of FIG. 3a, the round bond pad 410 is formed of a material which is readily wetted by solder (a material to which solder readily adheres in its molten state), such as copper or its alloys, gold or its alloys, silver or its alloys, or any of various plated combinations using these materials. The round ring-shaped bond pad 410 has a centrally located opening 415.

Figure 4B:
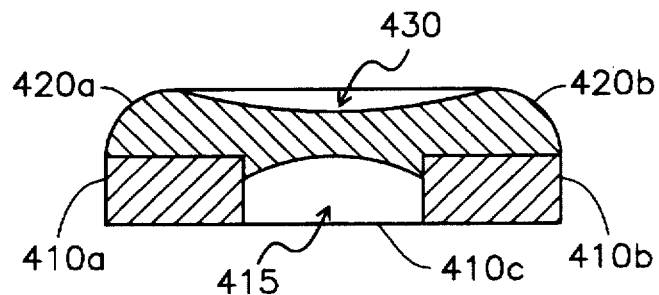
FIG. 4b is a cross-sectional view of another embodiment of a detented conductive bump contact, according to the present invention.

Solder paste is disposed over the surface of the bond pad 410 and is then re-flowed by applying heat. If a sufficient quantity of solder paste is employed, the resulting contact structure will appear as shown in FIG. 4b. In the illustration of FIG. 4b, the solder is shown having "bridged" the opening 415. The resulting contact structure exhibits a "detent" 430. In the cross-sectional view of FIG. 4b, a view is taken which slices roughly through the center of the round ring-shaped bond pad 410, thereby slicing through portions 410a and 410b on opposite sides of the bond pad 410. Another portion 410c of the bond pad 410 appears in the background. The solder paste re-flows over the bond pad 410 such that elevated portions 420a and 420b of the bump contact are formed. A generally centrally located depressed area 430 of the conductive bump contact is formed over the opening 415. Depending upon the environment and temperatures used in forming the solder bump contact, gaseous expansion/contraction can be used to contribute to the depth of the depression 430. As the solder paste is heated, trapped gas within the opening 415 expands. In cooling, a partial vacuum is formed which draws the solder paste over the opening 415 downward, thereby deepening the depression 430. This can be made particularly effective if a portion of the gas is permitted to escape (e.g., "vent", by bubbling through the molten solder paste during heating). In such a case, the volume of the gas (when cooled) is significantly reduced, thereby deepening the depression 430. Surface tension alone, however, can be used to form the conductive bump contact shape shown in FIG. 4b, since solder (in its molten state) adheres readily to the material of the bond pad 410 and is more or less "drawn" thereto, causing the greatest concentration of solder to form over the solid portions of the bond pad 410. As with the void (330, FIG. 3b) this depression 430 is useful for mechanically registering a mating conductive bump contact, as described in greater detail hereinbelow.

The bond pads 310 and 410 of FIGS. 3a and 4a are disposed on the surface (not shown) of one of two substrates to be joined together. The depressed (concave) areas 330 and 430 of the contact structures shown in FIGS. 3b and 4b are disposed on an opposite side of the bond pads from the substrate upon which the bond pads are disposed, and towards a corresponding convex bump structure of the "other" substrate (not shown).

It should be noted that by controlling the amount of solder paste used, either a "voided" solder bump contact (e.g., FIG. 3b) or a "detented" solder bump contact (e.g., FIG. 4b) can be formed. It should be understood that a detented solder bump contact can be formed atop a rectangular bond pad, and that a voided solder bump contact can be formed atop a round bond pad, although these variations are not specifically shown. Generally, in the context of a ring-like bond pad (e.g., FIG. 3a, FIG. 4a), if solder paste is disposed only over the solid portions of the bond pad (i.e., not over the opening) then the voided type of solder bump contact will be formed, and if solder paste is disposed over both the solid portions of the bond pad and the opening, then the detented type of solder bump contact will be formed.

The contact structures shown in FIGS. 3b and 4b are both "shaped", and are both concave, for receiving a corresponding convex solder bump (e.g., a ball) of another substrate (e.g., a die or a package).

Another technique for forming "shaped" conductive bump contacts is a controlled plating process. As is well known in the art, many different types of conductive materials can be selectively plated on a surface.

Figure 5:
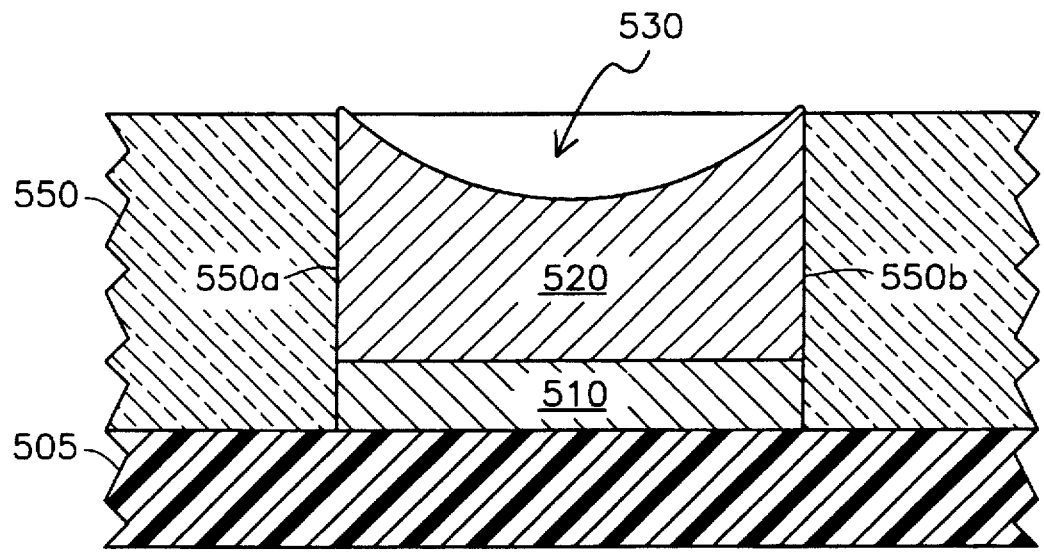
FIG. 5 "detented" a cross-sectional view of a "detented" conductive bump contact being formed, according to the present invention.

FIG. 5 is a cross-sectional view of a detented (concave) conductive bump contact 520 formed by a plating process. A substrate 505 has a solid (e.g., not necessarily ring-like) bond pad 510 disposed on a surface thereof, onto which the detented conductive bump contact 520 is to be formed. A masking material 550 is disposed over the surface of the substrate 505 covering all areas except those where the plating is to occur (e.g., over the bond pad 510). Vertical sidewalls 550a and 550b of an opening in the masking material 550 surround bond pad 510, in an area (atop the bond pad) whereat the bump contact is to be formed. An electroplating (or other suitable) process is then used to plate the conductive bump contact 520 onto the bond pad 510. By intentionally running the electroplating process in a chemically diffusion-limited region of its process window, the plate-up rate (rate of build-up of plated material) of the bump contact on the side walls of the masking material (i.e., at the edges of the conductive bump contact 520) is accelerated relative to the buildup rate near the center of the conductive bump contact 520. In this way the conductive bump contact 520 takes on the "castellated" shape shown in the figure, with a centrally located depression 530. ("Castellated" refers to the "castle shaped" cross-sectional top surface contour of the conductive bump contact 520, analogous to the shape of castle tower walls with "turrets".)

It should be noted that the plated conductive bump contact described with respect to FIG. 5 is not formed using re-flow techniques, and need not be made of solder. Any plate-able material (e.g., copper, silver, gold, or their alloys) may be used to form such castellated, concave, conductive bump contacts.

All of the formed (concave shaped) conductive bump contacts described hereinabove (whether formed by re-flow or plating techniques) have a centrally located detent or void (a concave center). This convex feature of the formed contacts may be applied to great advantage when mating contacts (of another substrate) having a convex shape (e.g., conventional solder bump contacts or other bump contacts) are used. This is shown and described hereinbelow with respect to FIGS. 6a and 6b, by way of example.

Figure 6A:
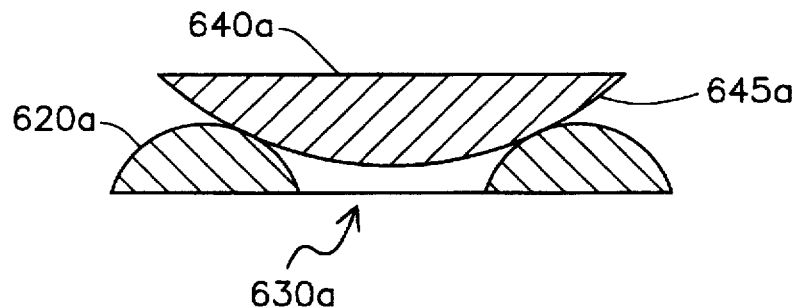
FIG. 6a is a cross-sectional view illustrating a convex conductive bump contact (e.g., ball; compare FIG. 1c), "nesting" in a detented conductive bump contact (bump) of the type shown in FIG. 3b, according to the present invention.

FIG. 6a is a cross-sectional view of a "conventional", ball-type, conductive bump contact 640a with a convex surface 645a "nesting" in a "void" 630a of a voided-type conductive bump contact 620a (compare FIG. 3b). The centrally-located "void" 630a in the voided conductive bump contact 620a effectively "captures" or "receives" the convex surface 645a of the conventional conductive bump contact 640a, providing very positive mechanical registration.

Externally applied pressure and/or gravity may be used to maintain the registration during assembly (e.g., during the process of fusing the contact 640a to the contact 620a).

Figure 6B:
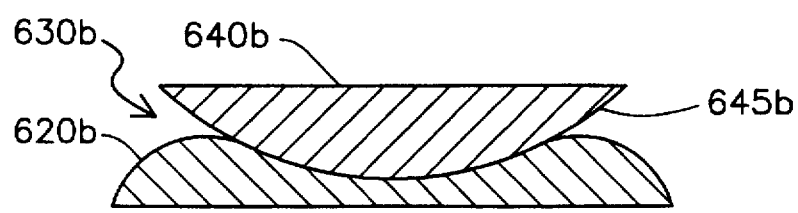
FIG. 6b is a cross-sectional view illustrating a convex conductive bump contact (e.g., ball; compare FIG. 1c), "nesting" in a detented conductive bump contact of the type shown in FIG. 4b, according to the present invention.

FIG. 6b is a cross-sectional view of another "conventional" conductive bump contact 640b with a convex surface 645b "nesting" in a depression 630b of a detented-type conductive bump contact 620b (compare FIG. 4b). In a manner similar to that shown and described with respect to FIG. 6a, the centrally-located depression 630b in the detented conductive bump contact 620b effectively "captures" or "receives" the convex surface 645b of the conventional conductive bump contact 640b, again providing very positive mechanical registration. As before, externally applied pressure and/or gravity may be used to maintain the registration during assembly.

Clearly, arrays of mated concave/convex conductive bump pairs of this type will provide very positive registration of a semiconductor device (e.g., chip or package) to a substrate (another chip or a substrate) prior to re-flow soldering (or other similar attachment technique).

It should be noted that for re-flow soldering of the conductive bump contacts (e.g., of one substrate to the contacts of another substrate), it is only necessary that one of the mating conductive bump contacts be formed of a flowable material (e.g., solder), and that the other be formed of a material "wettable" by the flowable material (a material, such as those mentioned hereinabove, to which the flowable material adheres well in its molten and cooled states). In fact, if one of the "pair" of mating contacts is formed of a non-flowable material (e.g., a copper, gold, or silver alloy), a significant advantage will accrue, as described hereinbelow. It should also be understood that all of the contacts of one of the substrates need not be of the same type (e.g., solder or wettable material), and that one of the substrates having contact structures (to be joined to another substrate having contact structures) may have both solder and wettable type contact structures, and may have both convex and concave type contact structures. Evidently, each pair of contact structures (i.e., the contact structure of one substrate and the corresponding contact structure of the other substrate) must be "compatible" in terms of both convex/concave end geometry as well as solderability with one another.

It is well known in the art that predictable and controllable spacing of micro-bump bonded parts (two substrates bump bonded to one another) is difficult to achieve. This is due, in part, to the unpredictable characteristics of large solder globs or of inaccurately controlled amounts of solder for the conductive bump contacts. In extreme cases, this can lead to either un-connected or shorted contacts. In less extreme cases, this can lead to unpredictable shape of the resulting fused joint, which causes unpredictable contact resistance (and other unpredictable, usually undesirable electrical and/ or mechanical characteristics).

According to the invention, either the concave contact (e.g., concave voided or detented conductive bump contact) or the convex contact (e.g., conventional solder ball or bump contact) is formed of a non-flowable material, and the other of the mating pair of contact structures is formed of solder. In this case, less solder is used, and the resulting fused joint will exhibit enhanced, more predictable mechanical and electrical characteristics. Further according to the invention, the non-flowable contact can function as a pre-formed "stand-off" between two substrates, further providing accurate spacing between micro-bump bonded components and enhancing the predictability of electrical and mechanical characteristics of the resultant conductive bump connections (joints). Depending upon process parameters, gas or flux trapped in the openings of ring-shaped bond pads during formation of concave conductive bumps by re-flow techniques (as shown and described with respect to FIGS. 3a–3b and 4a–4b) may cause very undesirable effects. Thermal expansion of the trapped gas, while useful in some cases (as described above), can cause explosive expulsion of the trapped gas through the molten solder, resulting in distorted (or destroyed) conductive bump shape. This is particularly troublesome in cases where trapped flux becomes hot enough to boil, in which case its volume increases rapidly and dramatically.

For such cases, ring-shaped bond pads with a "gap" or "vent" in the ring shape may be employed to allow expulsion of the expanding gas in a benign fashion. This is shown and described hereinbelow with respect to FIGS. 7a–c.

Figure 7A:
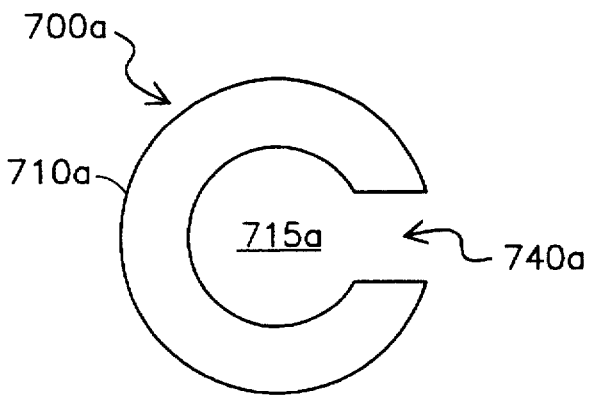
FIG. 7a is a top view of an embodiment of a "vented" bond pad, according to the present invention.

FIG. 7a shows a round "C-shaped" or "vented" bond pad 700a, having a round ring-shaped body 710a, a centrally located opening 715a, and a gap 740a in the body 710a of the bond pad 700a. The gap 740a is in direct communication with the opening 715a, from the exterior of the bond pad. In forming a micro-bump contact over a bond pad of this type (700a), the gap 740a acts as a "vent" to permit expanding gas (or vaporized flux) to escape.

Figure 7B:
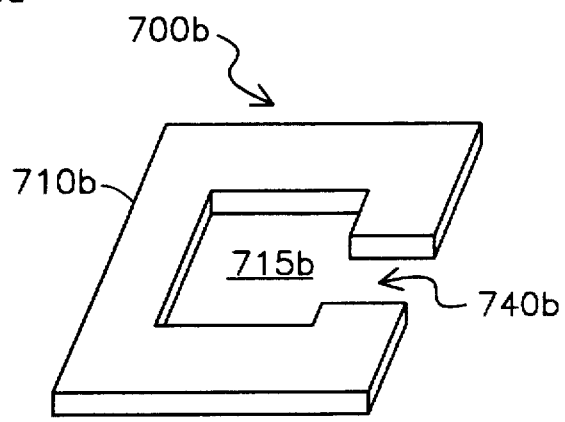
FIG. 7b is a perspective view of another embodiment of a "vented" bond pad, according to the present invention.

FIG. 7b shows a rectangular "C-shaped" or "vented" bond pad 700b having a rectangular ring-shaped body 710b, a centrally located opening 715b, and a gap 740b in the body 710b of the bond pad 700b. Except for the "squared" shape of the body, the rectangular "vented" bond pad 700b is very much like the round bond pad 700a (FIG. 7a). As with the round, vented bond pad 700a, the gap 740b of the rectangular, vented bond pad 700b is in direct communication with the opening 715b. As before, in forming a micro-bump contact over a bond pad of this type (700b), the gap 740b acts as a "vent" to permit expanding gas to escape.

Figure 7C:
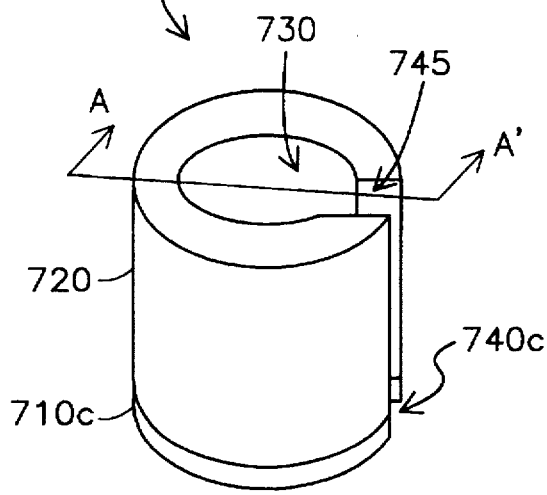
FIG. 7c is a perspective view of an embodiment of a "shaped" conductive bump contact formed on a "vented" bond pad, according to the present invention.

FIG. 7c is a perspective view of a "formed" conductive bump contact 700c, formed by building up a conductive contact structure 720 on top of a round, vented bond pad 710c, similar to that shown and described with respect to FIG. 7a. The conductive contact structure has, in the vertical direction, as depicted, substantially the same vented ring shape as the bond pad 710c. Hence, the contact structure is cylindrical in shape, with a slit through its wall. A centrally located "well" 730, (corresponding to the opening, e.g.

715a, in the bond pad 710c) is formed. A gap 745 in the ring shape of the conductive contact structure 720 extends the vent 740c of the bond pad vertically through the conductive contact structure, creating a "gapped", cylindrical shape.

The centrally located well, 730 serves as a concave opening for capturing or receiving a convex conductive bump contact, as with any of the other concave conductive bump structures described hereinabove. The well 730, then, helps to provide positive mechanical registration of a mating conductive bump contact to be fused to it. The well 730 can also be filled with flux to aid in the solder wetting process during re-flow. The gap 745 provides an escape path for expanding gas and/or molten flux during the reflow process.

Figure 7D:
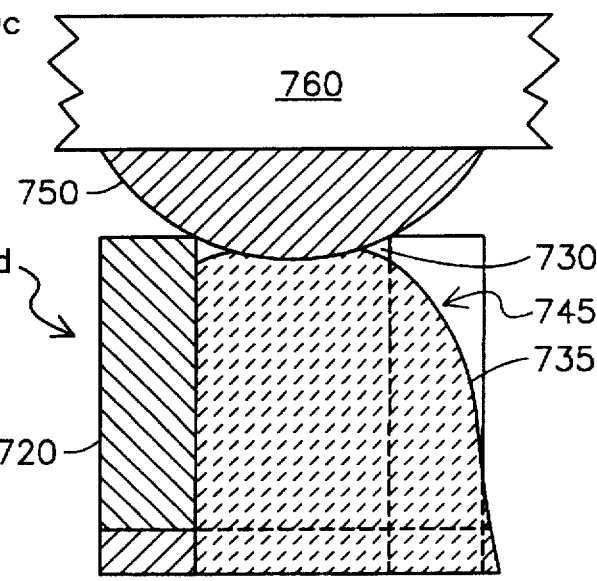
FIG. 7d is a cross-sectional view of an assembly of the "shaped" conductive bump contact of FIG. 7c, taken on a line AA' through FIG. 7c, and a mating "conventional" bond pad, according to the present invention.

FIG. 7d is a cross-sectional view A–A' of an assembly 700d of a "conventional" convex conductive bump contact 750 on a substrate 760 resting on the conductive contact structure 720 (which is disposed on another substrate, not shown). The conductive bump contact 750 has a convex surface contour and rests atop the conductive contact structure 720, intruding partially (nesting) into the well 730 formed therewithin. The well 730 (and the gap 745) may be filled with flux 735 to aid in the wetting process during subsequent re-flow. At least one of the conductive contact structure 720 and the conductive bump contact 750 is formed of a flowable material such as tin-lead solder. The other (720 or 750) may be formed of a non-flowable material, wettable by the flowable material, or of the same or a similar flowable material. In the event that either the conductive contact structure 720 or the conductive bump contact 750 is formed of a non-flowable material, the non-flowable contact (720 or 750) acts as a standoff, and aids in providing predictable contact height (e.g., spacing between the substrates) and predictable mechanical and electrical connection (fused joint) characteristics.

FIG. 8a is a cross-sectional view of an alternative detented (concave) conductive bump contact shape. A detented conductive bump contact 820a, formed of a conductive, preferably flowable material, is disposed atop a bond pad 810a. The detented contact has tapered sides 825, providing a progressively narrower shape as the distance from the bond pad 810a increases. A concave depression, "well" or void 830a in the top surface of the bump contact 820a provides the "detent" into which a mating convex conductive bump contact will fit. (Compare with 520, FIG. 5 having straight sides). The sides of the conductive bump contact 820a are substantially straight. If the bond pad 810a is rectangular, then the resultant conductive bump contact 820a has a pyramid shape. If the bond pad 810a is substantially round, then the resultant detented conductive bump contact 820a has a conical shape. (Actually, more of a "volcano" shape if the depression 830a is taken into account.)

FIG. 8b is a cross-sectional view of another alternative detented conductive bump contact shape. A detented conductive bump contact 820b, formed of a conductive, preferably flowable material, is disposed atop a bond pad 810b. The detented contact has a generally convex, rounded surface contour 825, except in the area of a "detent" or concave "well" or void (depression) 830b in the top portion of the surface, into which a mating convex conductive bump contact will fit. The detent 830b is preferably centrally located in the top surface of the conductive structure 820b. If a round bond pad 810b is used, then the detented conductive bump contact 820b will have a roughly spherical shape (ignoring the depression 830b). If a square or rectangular bond pad 810b is used, then the detented conductive bump contact 820b will have a roughly "pillow" shape (again, ignoring the depression 830b).

All of the mating bump contact arrangements described hereinabove take advantage of a naturally-occurring convex shape of a "conventional" conductive bump contact to provide registration and alignment. It is also possible, however, to provide a mating convex contact with a formed shape specifically designed to mate with the concave shape of a detented bump contact in a sort of a "pin and socket" arrangement. FIG. 9 illustrates a mating pair of contacts with such a configuration.

FIG. 9 is a cross-sectional view of a pre-reflow arrangement of two mating conductive bump contacts. A concave "detented" contact structure 920a ("socket" contact) is formed atop a first bond pad 910a disposed on a surface 926 of a first substrate 925. A concave "well" or "socket" 921 is generally centrally located within the detented contact structure 920a. A convex conductive bump contact 920b ("pin" contact) is formed in a "pin" shape, having a diameter (assuming a round shape) less than that of the "well" 921 (also assuming a round shape) in the detented contact structure 920a. The convex conductive bump contact 920b is formed on a second bond pad 910b disposed on a surface 906 of a second substrate 905. The two substrates 905 and 925 are positioned such that the "pin" shaped contact 920b extends into the "well" or "socket" of the detented conductive contact structure 920a. This arrangement provides positive mechanical alignment and registration of the two substrates prior to re-flow fusing of the contacts (920a and 920b).

Either of the two contacts may be formed of a non-flowable material (e.g., copper and its alloys, gold and its alloys, silver and its alloys) which is readily wettable by a flowable material (e.g., tin-lead (Sn-Pb) solder) of which the other of the two contacts is formed. In this case, the non-flowable contact acts as a stand-off during assembly, as previously described hereinabove. For example, the contact structure 910b can be formed of a non-flowable (e.g., solid) material. Alternatively, both contacts may be formed of a flowable material.

It should be noted that although bond pads, as depicted in the FIGS., are shown as having a height (presumably above a substrate, e.g. 910a, 910b FIG. 9) it is well known in the art to provide bond pads and/or conductive traces flush with the surface of a substrate, essentially creating an "inlaid" bond pad or conductive trace. It is therefore intended that the conductive bump contacts described herein may be disposed either atop a raised bond pad (such as is formed on a printed circuit board) or a flush bond pad. For the purposes of this specification, there is no difference between a conductive trace and a bond pad with respect to disposing a conductive bump contact or structure thereupon.

It is within the spirit and scope of the present invention that the various aspects of the various embodiments described hereinabove be used either alone or in combination. For example, the "pin and socket" contact arrangement shown and described with respect to FIG. 9 can be afforded many of the advantages of other embodiments by, for example, by filling the "socket" (921) with flux to aid in the wetting process during re-flow, and/or providing a gap or "vent" (compare 745) to permit the escape of expanding gas/and or flux.

It should further be understood that the mating contact structures of the present invention are shown greatly magnified. A plurality (e.g., an array) of such contact structures can be disposed on a surface of one or more semiconductor dies (one or more substrates) for joining the die to another die (another substrate). Alternatively, a plurality of such contact structures can be provided external to a semiconductor package (one substrate) for joining the package to a printed wiring board (another substrate) or the like. Alternatively, a plurality of such contact structures can be disposed on the surface of a semiconductor die (one substrate) for joining the die to a printed wiring board (another substrate) or the like. The term "substrate" is used herein to indicate an element having a surface containing contact structures.

The above disclosure describes improved mechanical formation and registration of connections formed by micro-bump bonding may be realized with the above mentioned formed or shaped conductive bump contacts. This is especially true when one of a pair of mating conductive bump contacts has a concave or detented surface contour to capture or receive a convex contour on the other one of the pair. Certain other advantages are obtained by including one or more semiconductor dies attached, as more fully discussed above, in a "system level product."

System level products may be designed and fabricated in various forms. A system level product may, for example, include a single chip modules ("SCM") having a single semiconductor die in a single package body, with or without other electrical components, such as capacitors. System level products may also include multi-chip modules ("MCM") having two or more semiconductor dies in the same or separate package bodies, with or without other electrical components. System level products may also include board level products ("BLP"), such as those having one or more semiconductor devices on one or more printed wiring boards. Box level products ("Boxes") are also system level products which may include a combination of SCMs, MCMs, BLPs, and/or other devices. One or more of such SCMs, MCMs, BLPs or Boxes may act as, or be integrated into, a functional system or subsystem or the like.

System level products can be employed to carry out numerous applications and in various environments. For example, system level products may include:

(a) digital data (or other memory) storage systems;

(b) security and surveillance systems;

(c) general purpose computers, such as personal computers, work stations, severs, mini computers, mainframe computers and super computers;

(d) digital audio, video compression and transmission systems;

(e) transportation vehicles, such as airplanes, trains, automobiles, helicopters, rockets, missiles, boats, submarines, and the like, as well as subsystems utilized in transportation vehicles, which include positioning systems (for example, global positioning systems), navigational displays and controllers, hazard avoidance systems (such as radar and sonar), fly by wire control systems and engine controlling and monitoring systems;

(f) entertainment systems, such as digital television, audio cameras, video recorders, compact disc players/recorders, and digital tape or other audio systems;

(g) communication systems, such as traditional or cellular telephones, private branch exchanges ("PBX"), telephone switches, voice processing systems (such as voice mail systems), network controllers, video teleconferencing equipment and digital data transmission systems or encoder/decoders (as are ordinarily used in conjunction with, for example, bus networks, token ring networks, star networks and ethernet networks); and (h) subsystems or subassemblies for inclusion or attachment to more complex system level products.

In a SCM, a single semiconductor die is packaged and adapted for connection to external systems. This usually involves mounting the die to some sort of substrate, lead frame or carrier, connecting the bond pads on the die to some sort of conductive leads or traces and forming a package body around the die. The conductive leads or traces exit the package body, and usually terminate in external leads or pins.

Figure 10:
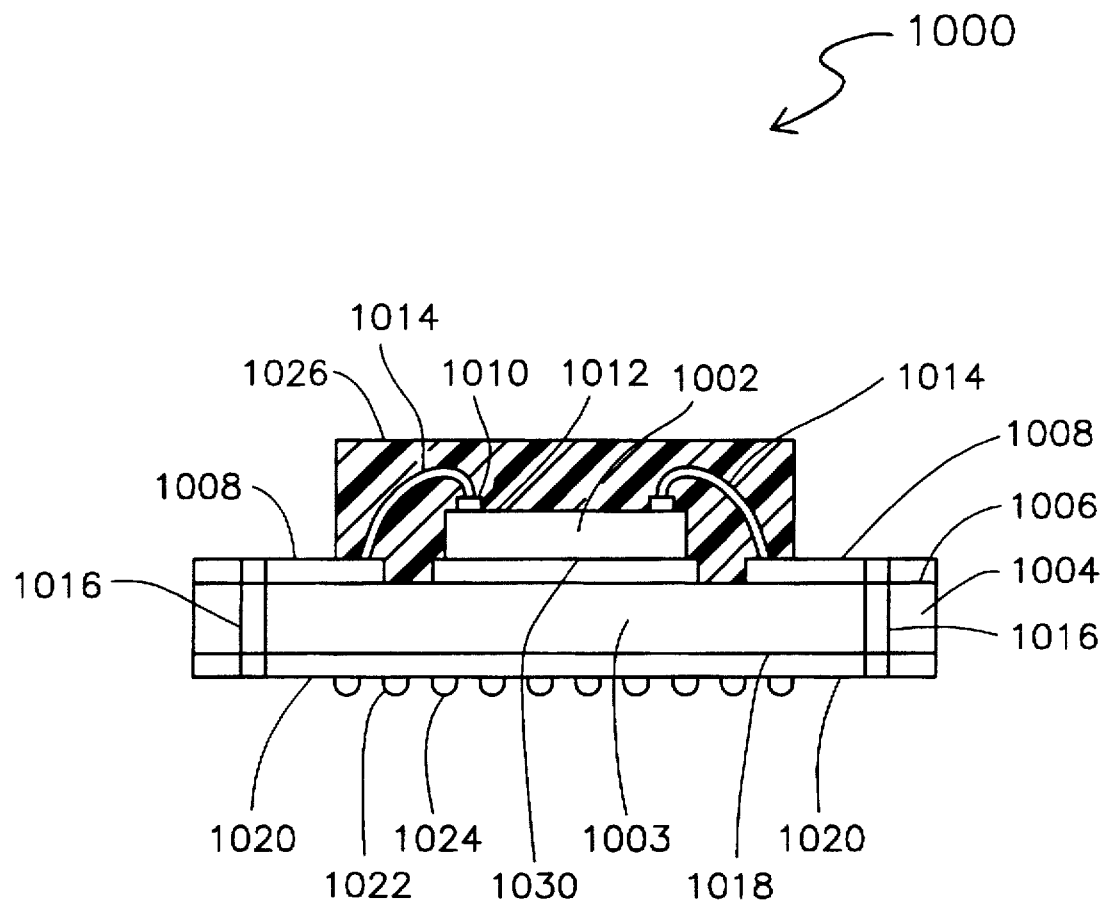
FIG. 10 is a schematic elevational view of a single chip module illustrated in cross section.

Referring to FIG. 10, an elevational view of a SCM is illustrated in cross section. The SCM 1000, as illustrated, is a ball bump grid array semiconductor package. A semiconductor die 1002 is mounted to the top surface of a central area 1003 of a substrate 1004. The semiconductor die has conductive lines 1012 formed thereon (not illustrated). The top surface 1006 of the substrate 1004 is provided with a number of conductive traces 1008 that extend from near the periphery of the substrate 1004 to the central area 1003. The die 1002 has bond pads 1010 thereon. Bond wires 1014 extend from the bond pads 1010 to inner ends of the traces 1008. Near the periphery of the substrate 1004, there are plated (conductive) through-holes (vias) 1016 extending from the bottom surface 1018 of the substrate 1004, through the substrate to a respective trace 1008. The bottom surface 1018 of the substrate is provided with a number of conductive traces 1020, each having an end connected with a respective via 1016. In this manner, signals (and power) to and from the die are connected through the bond wires 1014, through the top side traces 1008, through the vias 1016, to the bottom side traces 1020. A package body 1026 is formed over the die, and partially covers the top surface of the substrate 1004.

Pin grid array semiconductor packages, chip carriers (leaded or leadless), flat packs (such as plastic quad gullwing flat packs), ceramic packages and small outline integrated circuits are also examples of SCMs. Numerous other examples, designs and types of SCMs are known to those of ordinary skill in the art of semiconductor integrated circuit packages.

When two or more semiconductor dies are mounted in the same or separate package body, with or without other electrical components, the resulting assembly is typically referred to as a multi-chip module (MCM).

In order to connect to one of the two or more semiconductor dies of a MCM, a substrate having conductive traces (like substrate 1004 of FIG. 10) is often used. Additional components such as capacitors, resistors and inductors may be mounted to the substrate. Often, the interconnections between the various components mounted to the substrate necessitate a large number of conductive traces which need to cross one another. In such cases, it is known to provide a substrate, having alternating layers of insulating material (such as fiberglass, teflon, FR4, BT resin, and the like) and conductive trace patterns (typically formed of metal foils, such as copper). The conductive traces from one layer are typically connected to the conductive traces of another layer by plated through-holes or vias.

Figure 11:
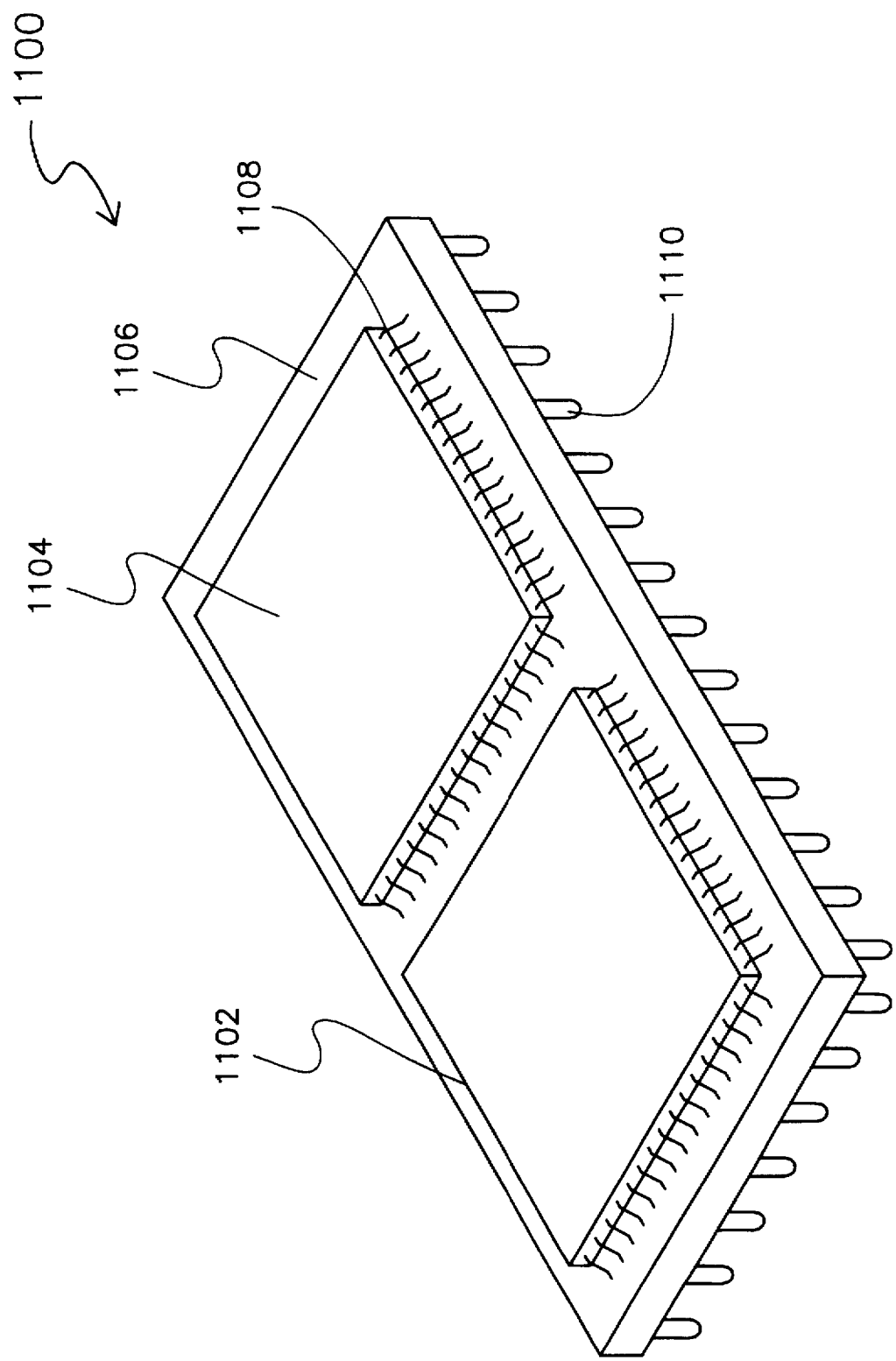
FIG. 11 is a schematic perspective view of a multichip module.

FIG. 11 illustrates a perspective view of a MCM. MCM 1100 comprises a substrate 1106 having conductive lines formed thereon (not illustrated), at least two semiconductor dies 1102 and 1104 disposed on the substrate 1106 and electrically connected to the substrate 1106 conductive lines by the outer tips of lead frame leads 1108. The dies 1102 and 1104 may be physically mounted to the substrate 1106 by attachment means known to those skilled in the art of semiconductor fabrication. The two semiconductor dies 1102 and 1104 are illustrated encapsulated, however, non-encapsulated dies on leadframes are also contemplated. One or more layers of conductive traces and plated through-holes (not illustrated) are disposed within substrate 1106 and are used to connect the semiconductor dies 1102 and 1104 to one another and to external connections 1110, such as micro-bump structures as described above. Additional electrical components, such as capacitors, resistors and inductors (not illustrated) may also be disposed on and connected to the substrate 1106. Numerous other examples, designs and types of MCMs are known to those of skill in the art of semiconductor packages.

A BLP typically includes one or more semiconductor devices (such as a single chip module and/or a multi-chip module), in addition to other components, on one or more printed wiring boards.

Figure 12:
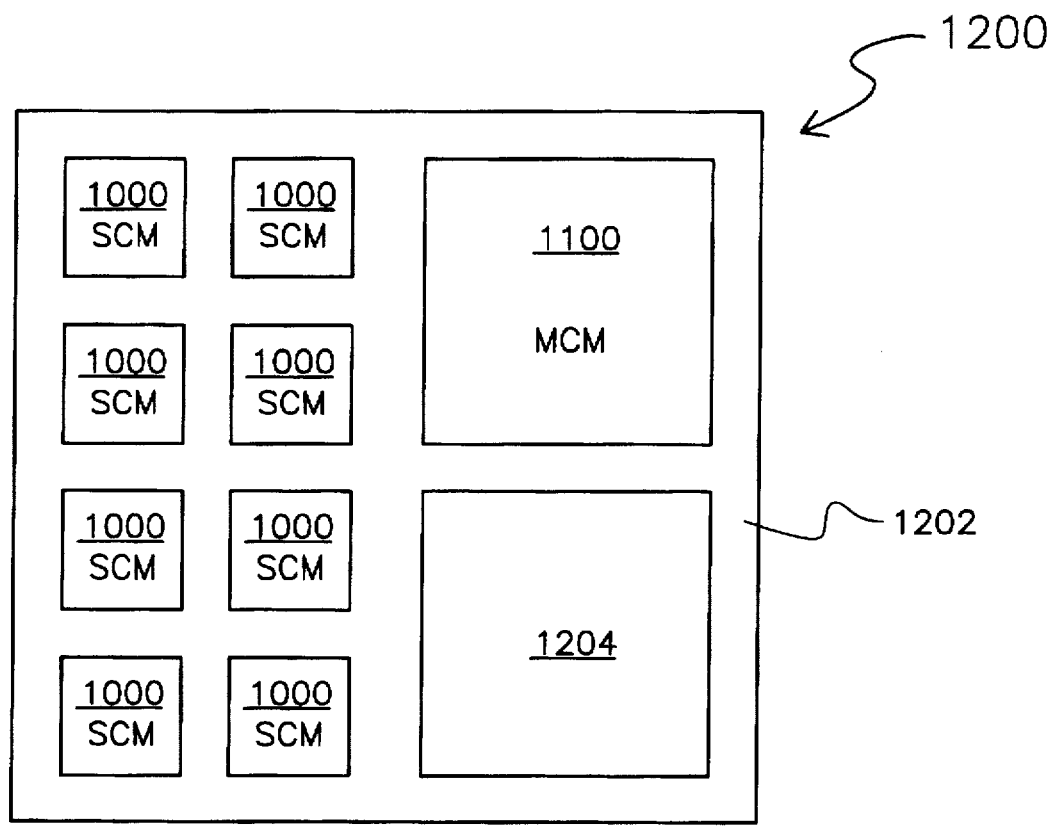
FIG. 12 is a schematic top view of a board level product.

FIG. 12 illustrates a top view of a board level product (BLP). The BLP 1200 comprises an array of SCMs 1000, a MCM 1100, and a memory component 1204. The SCMs 1000, the MCM 1100, and memory 1204 are each disposed on and connected to a printed wiring board 1202. The printed wiring board 1202 provides for all connections between those components. Examples of BLPs include central processing unit boards, memory boards, and interface boards (as are routinely utilized in computer systems).

Boxes are also system level products which may include a combination of SCMs, MCMs, BLPs, and/or other devices. For example, multiple board level products may be connected in parallel with one another by a bus (such as a backplane bus, which is also referred to as a mother board), which communicates signals therebetween. Numerous other examples, designs and types of Boxes are readily apparent to one of ordinary skill in the art. The conductive leads wires exit the boxes, and are usually terminated at external leads or pins.

Thus, the invention provides positive mechanical alignment between substrates using micro-bump contacts having detented conductive bump contacts on one substrate and convex contour bump contacts on the other substrate. The present invention is characterized by improved alignment and ease in fabrication, resulting in lower costs and enhanced reliability. The present invention is thus applicable to any digital technology requiring mounting of semiconductor dice in a digital system (SCM, MCM, BLP, Boxes and the like).

Other MCM, SCM, mini-board, micro-board, board level and other system subassemblies are contemplated using the shaped self-aligned micro-bumps of the present invention. Additionally, such sub-assemblies or packages using such self-aligned micro-bump structures may be used in traditional circuit boards or sub-assemblies for a system level product. Examples of digital systems that may benefit from the system and method of the present invention have been mentioned above. The spirit and intent of the present invention is to improve the mountability and reliability of, and cost to manufacture all digital systems from a single semiconductor integrated circuit die to a complex multiple box computing system.

The present invention, therefore, is well adapted to carry out the objects and attain the ends and advantages mentioned, as well as others inherent therein. While a presently preferred embodiment of the invention and various aspects thereto has been given for purposes of disclosure, numerous changes in the details of construction, interconnection arrangement of parts will readily suggest themselves to those skilled in the art and which are encompassed within the spirit of the invention and the scope of the appended claims.

What is claimed is:

1. A digital system having at least one semiconductor integrated circuit package assembly attached to at least one substrate with conductive bump contacts, said system comprising:

a conductive material extending from a surface of a substrate, one end of the conductive material supported on the surface of the substrate and an other end of the conductive material elevated above the surface of the substrate;

a concave depression formed in the other end of the conductive material, said concave depression being perpendicular to the surface of the substrate and extending completely through the conductive material and sized and shaped to receive and align with a corresponding conductive bump contact having a convex end; and a vent opening formed through the conductive material between the concave depression and an external surface of the conductive material.

2. The system of claim 1, wherein the conductive material is a heat re-flowable material.

3. The system of claim 1, wherein the conductive material is a non-reflowable material.

4. The system of claim 1, wherein:

the conductive material has a substantially straight external surface extending between the one end and the other end.

5. The system of claim 1, wherein:

the conductive material has a tapered external surface extending between the one end and the other end.

6. The system of claim 1, wherein:

the conductive material has a generally rounded, convex shaped external surface outside of the area of the concave depression.

7. The system of claim 1, wherein:

the concave depression extends completely through the conductive material, from the one end to the other end.

8. The system of claim 1, further comprising:

a vent opening disposed in the conductive material, said vent opening extending between the concave depression and the an external surface of the conductive material.

9. The system of claim 1, further comprising:

a conductive bond pad disposed between the one end of the conductive material and the surface of the substrate.

10. The system of claim 9, wherein: the conductive bond pad has a solid shape.

11. The system of claim 9, wherein:

the conductive bond pad has a ring-shaped body with a generally centrally located opening.

12. The system of claim 11, wherein:

the conductive material is disposed only on the ring-shaped body of the conductive bond pad.

13. The system of claim 9, wherein:

the conductive bond pad has a ring-shaped body with a generally centrally located interior opening; and further comprising:

a vent disposed through the ring-shaped body and extending from the interior opening to an exterior of the bond pad.

14. The system of claim 9, wherein:

the conductive bond pad has a generally rectangular shape.

15. The system of claim 9, wherein:

the conductive bond pad has a generally rounded shape.

16. The system of claim 1, further comprising:

flux disposed within the concave depression.

17. The system of claim 1, wherein:

the convex end of the corresponding conductive bump contact is shaped like a pin; and the concave depression is sized and shaped to receive the pin-shaped convex end.

18. A digital system having at least one semiconductor integrated circuit package assembly attached to at least one substrate with self-aligning pairs of conductive bump contacts, said system comprising:

a first bump contact extending from a surface of a first substrate and having an end with a convexity; and a second bump contact having a ring-shaped body with a generally centrally located opening therein and a vent opening to permit expanding gas to escape therefrom, said second bump contact extending from a surface of a second substrate and having an end with a concavity shaped to receive the convexity of the first bump contact.

19. The system of claim 18, wherein:

the first substrate is at least one semiconductor die.

20. The system of claim 18, wherein:

the first substrate is a semiconductor package.

21. The system of claim 18, wherein:

the second substrate is at least one semiconductor die.

22. The system of claim 18, wherein:

the second substrate is a printed wiring board.

23. The system of claim 18, wherein:

the first bump contact is formed of a first conductive material; and the second bump contact is formed of a second conductive material.

24. The system of claim 23, wherein:

the first conductive material is a flowable material; and the second conductive material is a flowable material.

25. The system of claim 23, wherein:

the first conductive material is a non-flowable material; and the second conductive material is a flowable material.

26. The system of claim 23, wherein:

the first conductive material is a flowable material; and the second conductive material is a non-flowable material.

27. The system of claim 18, wherein:

the first bump contact is pin-shaped; and the second bump contact is socket-shaped, and receives the end of the pin-shaped first bump contact.

28. The system of claim 18, wherein:

both of the conductive bump contacts are formed of a heat re-flowable material.

29. The system of claim 18, further comprising:

flux disposed within the centrally located opening of said second bump contact.

30. The system of claim 18, further comprising:

a gap disposed in the second conductive bump contact and extending from the centrally located opening of the second bump contact to an external surface of the second bump contact.

31. The system of claim 18, wherein the digital system is a single chip module.

32. The system of claim 18, wherein the digital system is a multi-chip module having at least one integrated circuit.

33. The system of claim 18, wherein the digital system is a board level product having a plurality of integrated circuits on at least one printed wiring board.

34. The system of claim 18, wherein the digital system is a box level system having a plurality if integrated circuits on at least one printed wiring board mounted into a box with a power source.

35. The system of claim 18, wherein the digital system is selected from the group comprising personal computers, work stations, servers, minicomputers, mainframe computers and super computers.

36. The system of claim 18, wherein the digital system is selected from the group comprising security systems, entertainment systems, data storage systems, data acquisition systems, telecommunications systems and satellite systems.

37. The system of claim 18, wherein the digital system is selected from the group comprising digital video systems, digital audio systems, digital entertainment systems, direct broadcast digital video systems, and digital video cable systems.

38. The system of claim 18, wherein the digital system is selected from the group comprising televisions, cameras, recorders, compact disc players/recorders, and digital tape players/recorders.

39. The system of claim 18, wherein the digital system is selected from the group comprising cellular telephones, private branch exchange, telephone switching, video picture telephones, network controllers, encoders and decoders.

40. The system of claim 18, wherein the digital system is selected from the group comprising control, monitoring and navigational systems for airplanes, trains, automobiles, helicopters, rockets, missiles, boats and submarines.

* * * * *